United States Patent
Rashid

(10) Patent No.: US 8,204,251 B2
(45) Date of Patent: Jun. 19, 2012

(54) AMPLIFIER APPARATUS AND METHOD

(75) Inventor: Tahir Rashid, Berkshire (GB)

(73) Assignee: Wolfson Microelectronics plc, Edinburgh (GB)

( * ) Notice: Subject to any disclaimer, the term of this patent is extended or adjusted under 35 U.S.C. 154(b) by 1334 days.

(21) Appl. No.: 11/892,642

(22) Filed: Aug. 24, 2007

(65) Prior Publication Data

US 2008/0056513 A1    Mar. 6, 2008

(30) Foreign Application Priority Data

Aug. 31, 2006    (GB) .................................. 0617199.5

(51) Int. Cl.
*H04B 15/00*    (2006.01)
(52) U.S. Cl. ...................... 381/94.5; 381/94.6; 381/94.8
(58) Field of Classification Search .................. 341/144, 341/118, 143; 381/28, 94.1, 94.4, 94.5, 94.8, 381/111, 120, 121; 327/309, 321, 322, 538
See application file for complete search history.

(56) References Cited

U.S. PATENT DOCUMENTS

| | | | |
|---|---|---|---|
| 5,642,076 A * | 6/1997 | Naokawa et al. | 330/149 |
| 6,405,093 B1 * | 6/2002 | Malcolm et al. | 700/94 |
| 6,522,278 B1 | 2/2003 | Rhode et al. | |
| 6,775,387 B1 | 8/2004 | Mavencamp et al. | |
| 7,254,244 B2 * | 8/2007 | Henson et al. | 381/120 |
| 7,991,169 B2 * | 8/2011 | McHugh et al. | 381/94.5 |
| 2007/0030038 A1 * | 2/2007 | McHugh et al. | 327/100 |

FOREIGN PATENT DOCUMENTS

| | | |
|---|---|---|
| EP | 1229639 A2 | 8/2002 |
| JP | 55091211 | 7/1980 |

* cited by examiner

*Primary Examiner* — Fan Tsang
*Assistant Examiner* — Eugene Zhao
(74) *Attorney, Agent, or Firm* — Dickstein Shapiro LLP

(57) ABSTRACT

An amplifier start-up apparatus for reducing transient signals in a circuit, for example an audio circuit, comprising a reference voltage generator circuit for generating a reference voltage. The reference voltage generator circuit comprises a capacitor for maintaining the reference voltage at a desired level. The amplifier start-up apparatus comprises a control circuit for controlling the operation of the reference voltage generator circuit during power-up. The control circuit comprises an amplifier with a positive feedback path for controlling a current flow to the capacitor.

29 Claims, 11 Drawing Sheets

AMPLIFIER APPARATUS AND METHOD

TECHNICAL FIELD

The invention relates to an amplifier apparatus and method for reducing unwanted transient signals, and in particular to an amplifier start-up apparatus and method for reducing unwanted audible signals generated by transient signals in an audio amplifier circuit.

BACKGROUND

"Click" and "pop" are terms used to describe unwanted audio-band transient signals that are heard in a headphone or a speaker when an audio amplifier is enabled.

In portable audio applications power consumption is a key issue, which means that circuit components, such as audio amplifiers, are often disabled or powered down when not required. This can lead to unwanted audio-band transient signals being produced, both when an audio amplifier is powered down or placed in a sleep or hibernation mode, and when an audio amplifier is powered up or enabled from a sleep or hibernation mode. Similar problems can also arise in other non-portable applications.

Click and pop problems are particularly problematic in single supply amplifiers that have to charge to a certain defined voltage during power-up.

FIG. 1 shows a known audio amplifier circuit 1 for driving a load 2, for example a headphone or a speaker, coupled to an output terminal 3. An output amplifier 5 receives an audio signal at a first input terminal 7 from an audio source, such as a mixer 9. It will be appreciated that the mixer 9 receives an audio signal from a DAC (not shown) or other signal source. The amplifier 5 also receives a reference voltage $V_{MID}$ at a second input terminal 11. In order for the output signal of the amplifier to achieve maximum swing, either side of its quiescent output voltage, this quiescent voltage is set midway between the supply voltages VDD and ground (GND). The quiescent voltage is set be an applied reference voltage $V_{MID}$, equal to VDD/2.

The reference voltage $V_{MID}$ is produced by a reference voltage generator circuit 13. As will be described in greater detail below, a transient signal may be produced when the reference voltage generator circuit 13 is powered up, thereby causing an unwanted "pop" being transmitted to the headphone or speaker.

It is noted that control logic 10 is provided for controlling the operation of the output amplifier 5 during power up and mute operations. For example, the control logic 10 provides a control signal $S_1$ for controlling the reference generator circuit 13, a control signal $S_2$ for controlling the amplifier 5 (for example when performing a mute operation), and a control signal $S_3$ for controlling a buffer circuit 14. The buffer circuit 14 buffers the reference voltage $V_{MID}$ received from the reference voltage generator circuit 13. It is noted that the buffer circuit 14 is not essential to the operation of the amplifier circuit.

Referring to the flow chart of FIG. 2, a brief description of a typical power-up sequence is provided. A similar sequence of operations will occur when the amplifier is re-enabled (i.e. enabled) after a, period of being disabled (i.e. after hibernation). On initial application of power, step 201, the signal path from input to output is in a mute state, i.e. in a state where the output is unaffected by the input signal, for example by interrupting the signal path using a switch. The amplifier 5 is in a disabled state, i.e. not driving its output.

The reference voltage generator circuit 13 that produces the reference voltage $V_{MID}$ is then enabled, step 203. This is performed, for example, by closing the switch 131 of FIG. 1. There is a delay while the reference voltage stabilises, and while the decoupling and AC coupling capacitors charge, step 205. This delay can take approximately 1 second based on total capacitive load. It is noted that the AC coupling capacitor 15 may be charged, for example, using a bypass signal path having a bypass switch 17 as shown in FIG. 1. This allows the reference voltage $V_{MID}$ to bypass the disabled amplifier 5 and charge the AC coupling capacitor 15 to $V_{MID}$.

Once the reference voltage $V_{MID}$ has settled the output amplifier 5 is enabled, step 207. The amplifier 5 is then un-muted, step 209, thereby connecting the amplified audio signal to the output terminal 3.

Since the reference voltage $V_{MID}$ is connected to the load 2, via bypass switch 17, when the reference voltage generator circuit 13 is being enabled a "pop" is produced due to a slope discontinuity, i.e. rapid deviation or change, in the rate of change of the reference voltage $V_{MID}$ across the capacitor 135. The slope discontinuity produces audible signal components that propagate through to capacitor 15 and onto the load 2, thereby causing an audible click or pop.

FIG. 3 shows a typical reference voltage generator circuit 13 for producing the reference voltage $V_{MID}$. The reference voltage $V_{MID}$ can be produced using a potential divider circuit, for example, that comprises resistive elements 137 and 139. If the voltage level of the reference voltage is chosen to be VDD/2, then the resistive elements 137 and 139 will have equal values. It will be appreciated that the resistive elements 137 and 139 would have different values if a different reference voltage was required. A decoupling capacitor 135 is connected across resistive element 139. It is noted that, in the case of an integrated circuit arrangement, the decoupling capacitor 135 may be provided off-chip, if desired, and is used to decouple the $V_{MID}$ node 133. A switch 131 is provided for enabling and disabling the reference voltage generator circuit 13 under control of the control signal $S_1$.

FIG. 4 shows the $V_{MID}$ voltage at node 133 during power-up of the reference voltage generator circuit 13 when the audio amplifier is enabled or powered-up. Before the reference voltage generator circuit 13 is switched on at $t_{ON}$, the decoupling capacitor 135 is effectively short-circuited to ground via resistor 139. When the reference voltage generator circuit 13 is switched on at $t_{ON}$, this results in a rapid deviation or change in the reference voltage $V_{MID}$ across the capacitor 135. As the decoupling capacitor 135 continues to charge, the rise in the voltage $V_{MID}$ becomes more gradual until the desired reference voltage $V_{MID}$ is reached. This slope discontinuity of the reference voltage $V_{MID}$ at $t_{ON}$ is what causes the audible pop.

One method of avoiding these slope discontinuities would be to increase the value of resistor 139. However, an increased value of resistor 139 would lead to an unacceptably long charge time (e.g. 5 to 10 seconds), whereas the charge time is desired to be a few hundred milliseconds Due to the above mentioned click and pop problems, it is therefore an aim of the present invention to provide an apparatus and method for reducing unwanted signals in an audio circuit.

SUMMARY

According to a first aspect of the invention, there is provided an amplifier start-up apparatus for reducing transient signals in an audio circuit comprising a reference voltage generator circuit for generating a reference voltage, the reference voltage generator circuit comprising a capacitor for maintaining the reference voltage at a desired level. The apparatus comprises a charging control circuit for controlling the operation of the reference voltage generator circuit during power-up. The charging control circuit comprises an amplifier with a positive feedback path for controlling a current flow to the capacitor.

The amplifier start-up apparatus has the advantage of reducing or minimising audible transient signals during power-up of an audio amplifier.

According to another aspect of the present invention, there is provided a method for reducing transient signals in an audio circuit comprising a reference voltage generator circuit for generating a reference voltage, the reference voltage generator circuit comprising a capacitor for maintaining the reference voltage at a desired level. The method comprises the steps of providing a charging control circuit for controlling the operation of the reference voltage generator circuit during power-up, and controlling a current flow to the capacitor of the reference voltage generator circuit using an amplifier with a positive feedback path.

According to further aspects of the invention, there are provided various systems employing the amplifier start-up apparatus as defined in the appended claims. These include, but are not limited to, audio apparatus, portable audio apparatus, headphone amplifiers, headphones, communications apparatus (e.g. mobile phones), and in-car audio apparatus.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

Figure 1:
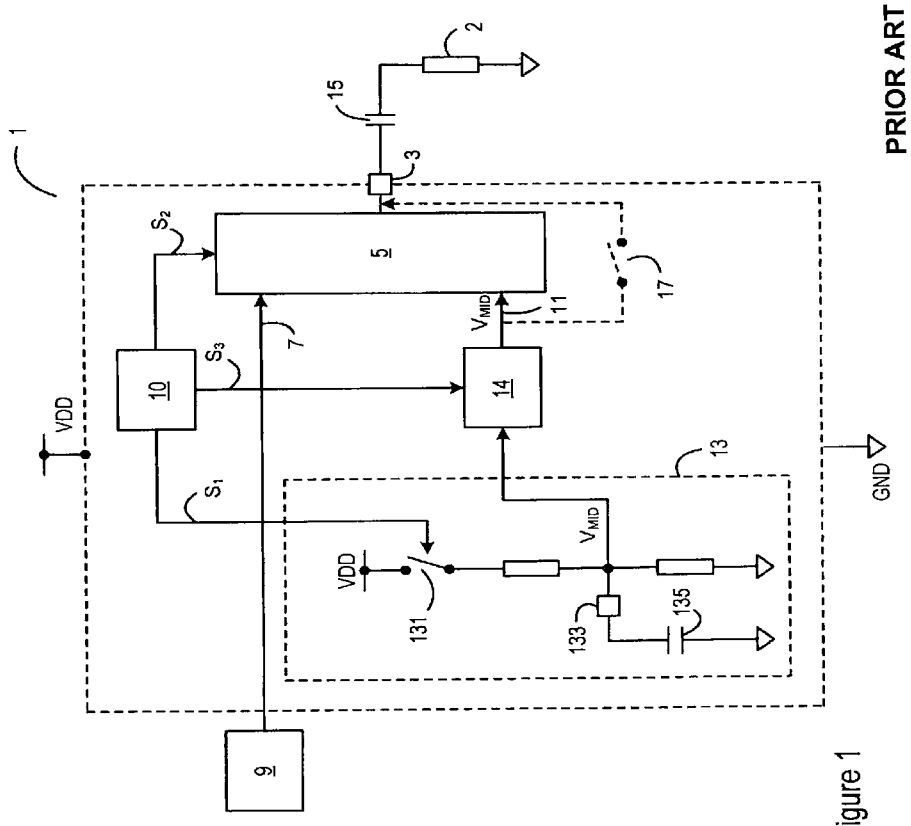
FIG. 1 shows an audio circuit according to the prior art.
Figure 2:
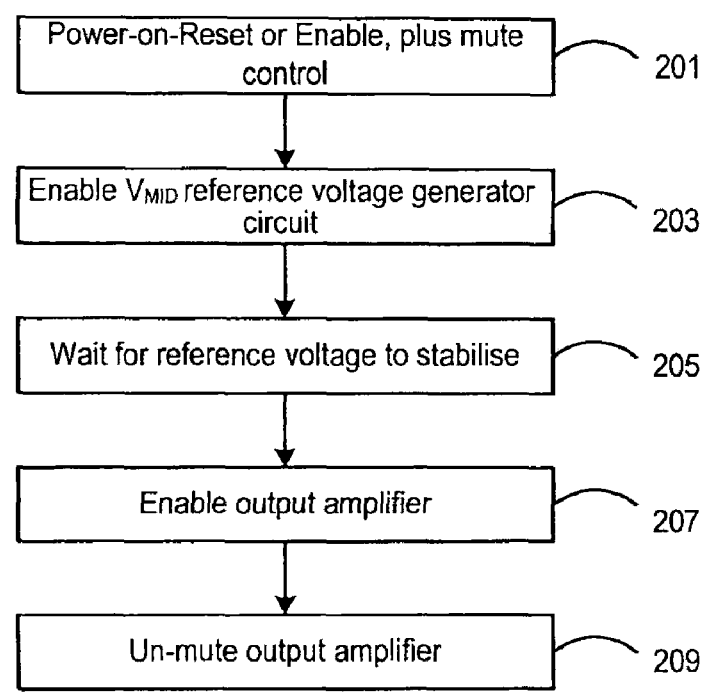
FIG. 2 describes a typical power-up sequence for the circuit shown in FIG. 1.
Figure 3:
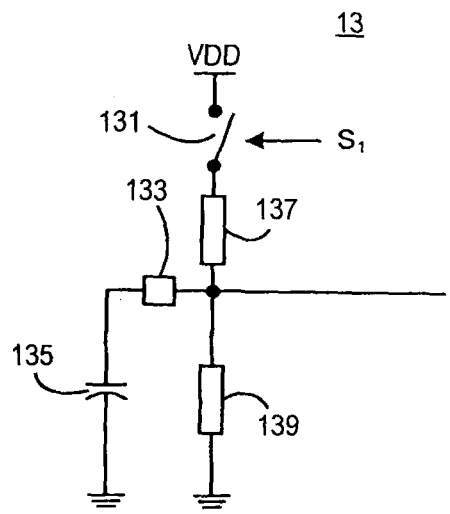
FIG. 3 shows a reference voltage generator circuit according to the prior art.
Figure 4:
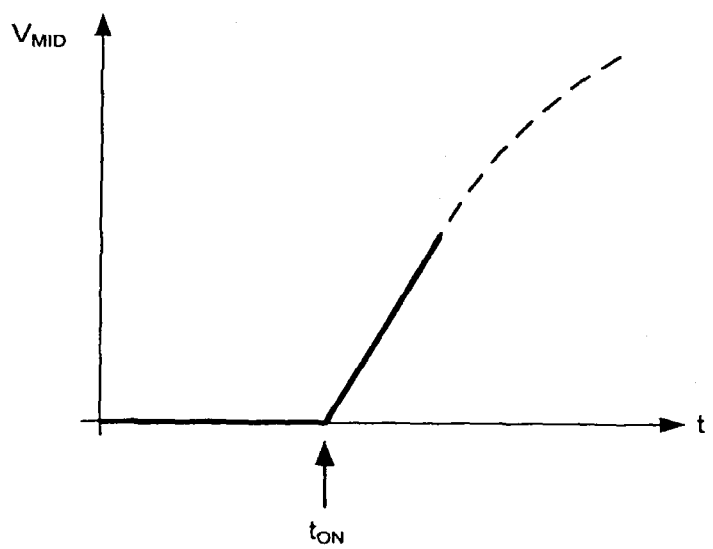
FIG. 4 is a graph showing how the reference voltage generated by the circuit of FIG. 3 is formed during a power-up operation.
Figure 5:
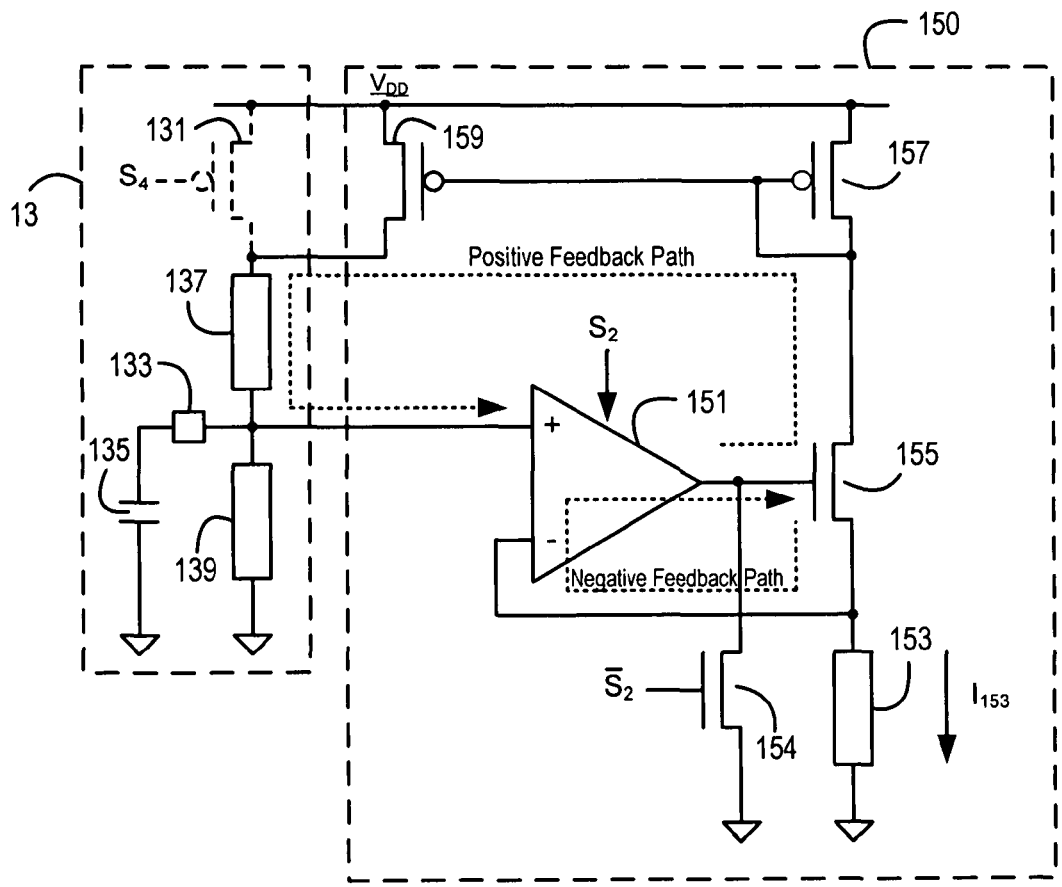
FIG. 5 shows a reference voltage generator circuit having an amplifier start-up apparatus according to a first embodiment of the present invention.

FIG. 5 shows an amplifier start-up apparatus for reducing unwanted signals in an audio circuit according to a first embodiment of the present invention. In a similar manner to FIG. 3, a reference voltage generator circuit 13 for producing a reference voltage $V_{MID}$ comprises a potential divider circuit comprising resistive elements 137 and 139. The resistive elements 137 and 139 can be chosen, for example, to provide a reference voltage that is mid-way between the supply rails of VDD and ground. A decoupling capacitor 135 is connected across resistive element 139. The decoupling capacitor 135 acts to maintain the reference voltage at a desired voltage level during operation. The decoupling capacitor 135 may be provided off-chip, if desired, and is used to decouple the $V_{MID}$ node 133.

However, rather than using the switch 131 (for example an PMOS transistor) to enable the reference voltage generator circuit 13, the amplifier start-up apparatus comprises a charging control circuit 150 for enabling the reference voltage generator circuit 13 in a controlled manner. According to the invention the charging control circuit 150 controls the rise of the reference voltage $V_{MID}$ as will be described below.

The charging control circuit 150 comprises a transistor device 159, for example a PMOS transistor, connected to the supply voltage VDD for controlling the flow of current to the reference voltage generator circuit 13, and hence the flow of current to the capacitor 135. The charging control circuit 150 comprises an amplifier 151, for example a differential amplifier, configured in a positive feedback arrangement for controlling the operation of the transistor device 159. The differential amplifier 151 receives the reference voltage from node 133 at its positive terminal. The output of the differential amplifier 151 drives a first NMOS transistor 155, the source voltage of the NMOS transistor 155 being fed back as an input to the negative terminal of the differential amplifier 151. The source of NMOS transistor 155 is also connected to ground via resistor 153. The voltage across resistor 153 mirrors the voltage at node 133, i.e. $V_{MID}$, and as a result the current $I_{153}$ through resistor 153 equals $V_{MID}/R_{153}$. It will be appreciated that this functionality of the differential amplifier 151 creates a negative feedback path. The current $I_{153}$ is mirrored through PMOS transistors 157 and 159.

Preferably, the amplifier start-up circuit comprises an NMOS transistor 154 which pulls down the output of amplifier 151 when the amplifier is disabled (i.e. by $S_2$ changing state). The transistor 154 is controlled by control signal $\bar{s}_2$, where $\bar{s}_2$ is the complement of control signal $S_2$.

Prior to start-up of the amplifier circuit, the transistor 131 is switched off and the output of amplifier 151 pulled to ground via transistor 154. Assuming that the decoupling capacitor 135 is fully discharged prior to time $t_{ON}$, the voltage at node 133, i.e. $V_{MID}$, will be 0 v.

During initial power-up at time $t_{ON}$ the current used to charge the capacitor 135 is provided by PMOS transistor 159, which charges the capacitor 135 in a controlled manner. Since the current through PMOS transistor 159 mirrors the current $I_{153}$ through resistor 153, which in turn mirrors the voltage at node 133, it will be appreciated that the PMOS transistor 159 causes the capacitor 135 to charge faster over time due to the positive feedback loop between the output of the amplifier 151, via transistors 155, 157, 159, resistor 137 and the positive input terminal of the amplifier 151. This in turn causes the reference voltage $V_{MID}$ to rise faster. As the reference voltage $V_{MID}$ rises the additional current from PMOS transistor 159 also rises. Eventually transistor 159 becomes turned hard-on and the charging current is defined by the RC time constant of resistors 137, 139 and capacitor 135.

From the above it can be seen that the charging control circuit 150 operates in two modes of operation. During a first period of operation the charging of the capacitor 135 is controlled via the positive feedback loop between the output of the amplifier 151 via transistors 155, 157, 159, resistor 137 and the positive input terminal of the amplifier 151. During a second period of operation (i.e. when the transistor 159 is hard-on), the charging of capacitor 135 is controlled by the RC time constant of the reference voltage generator circuit.

Figure 6:
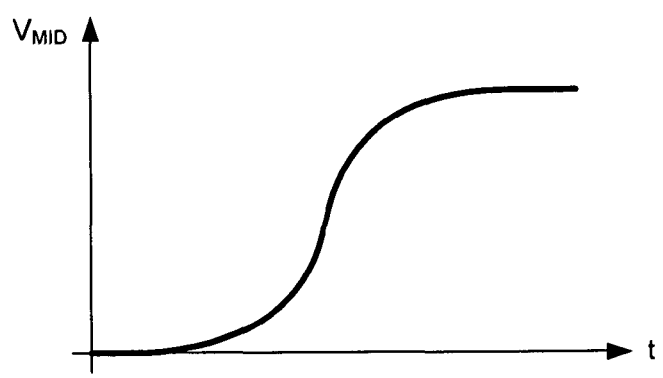
FIG. 6 shows how a reference voltage is generated using the apparatus of FIG. 5.

In this way the slope of the reference voltage $V_{MID}$ is made to initially rise in a much more continuous manner and in the form of an S-type waveform shape as illustrated in FIG. 6. In other words, the sudden slope discontinuity at $t_{ON}$ is no longer exhibited and, instead, the reference voltage $V_{MID}$ rises in a smoother and more controlled manner, thereby minimising or suppressing the high frequency components associated with the prior art waveform which causes "click" or "pop" effects on the output of the amplifier. After the initial gradual and smooth rise in the slope of the reference voltage $V_{MID}$, the reference voltage then rises more rapidly, followed by another gradual and smooth transition to its final value as the capacitor 135 completes its charging process.

It will be appreciated that the invention has the advantage of attenuating and preferably preventing unwanted audio-band signals caused by the slope discontinuity of $V_{MID}$ from causing undesired "pop" sounds during initial power-up of the reference voltage generator circuit, while still allowing the reference voltage generator circuit to reach the desired reference voltage $V_{MID}$ in a timely manner.

It is noted that the amplifier start-up apparatus can be used with other types of reference voltage generator circuits known to those skilled in the art for generating the reference voltage, other than the potential divider circuit shown in the preferred embodiment.

It will also be appreciated by a person skilled in the art that the arrangement of each PMOS and NMOS transistor shown in the preferred embodiment could be replaced by an NMOS or PMOS device, respectively, or other devices such as bipolar devices, provided that the circuit is adapted accordingly.

Since power consumption is an increasingly important factor, especially in relation to portable audio devices such as portable music players, it will be appreciated that the charging control circuit 150 is preferably turned off after the initial power-up sequence in order to conserve power. Prior to the charging control circuit 150 being disabled, the transistor 131 can be biased as a hard switch by control signal $S_4$, such that resistor 137 is tied to VDD and hence the voltage across capacitor 135 is maintained. Therefore, in the second period of operation the amplifier and its positive feedback path can be disabled, and the transistor 131 used to maintain the charge on the capacitor 135.

Figure 7:
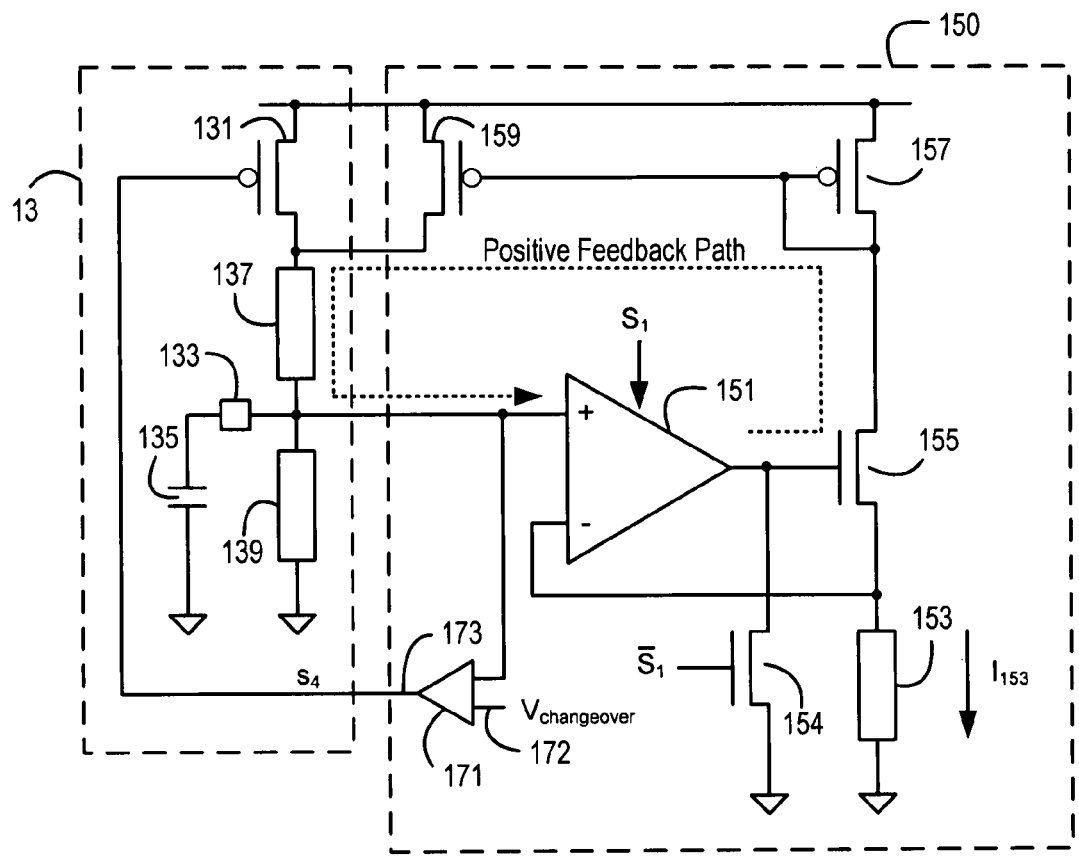
FIG. 7 shows an apparatus according to a second embodiment of the present invention.

FIG. 7 shows a circuit arrangement according to another embodiment of the present invention, which provides a means of controlling switch 131.

In a similar manner to FIG. 5, the reference voltage generator circuit comprises a potential divider circuit comprising resistive elements 137 and 139. A decoupling capacitor 135 is connected across resistive element 139. The charging control circuit 150 comprises a differential amplifier 151 configured in a positive feedback arrangement for limiting the current drawn through capacitor 135 during initial power-up.

As before, the output of the differential amplifier 151 drives a first NMOS transistor 155, the source voltage of the NMOS transistor 155 being fed back as an input to the differential amplifier 151. The source of NMOS transistor 155 is also connected to ground via resistor 153. The voltage across resistor 153 mirrors the voltage at node 133, i.e. $V_{MID}$, and as a result the current $I_{153}$ through resistor 153 is $V_{MID}/R_{153}$.

This current is mirrored through PMOS transistors 157 and 159, such that PMOS transistor 159 charges capacitor 135, thereby causing voltage $V_{MID}$ to rise faster. As voltage $V_{MID}$ rises the additional current from PMOS transistor 159 also rises.

A switching circuit is provided for causing the current through capacitor 135 to be charged via the switch 131 after $V_{MID}$ reaches a threshold voltage ($V_{CHANGEOVER}$), thereby enabling the control circuit 150 to be disabled. For example, a comparator 171 may be provided for comparing the voltage level of the reference voltage $V_{MID}$ with the threshold voltage 172 ($V_{CHANGEOVER}$). The threshold voltage 172 for the comparator 171 is chosen such that the switchover from control circuit 150 to transistor 131 occurs at a voltage level somewhere between ground and the desired reference voltage $V_{MID}$. Preferably, the threshold voltage is set midway between ground and $V_{MID}$, in which case the threshold voltage 172 for the comparator 171 is selected as being VDD/4 (i.e. $V_{MID}/2$).

Figure 8:
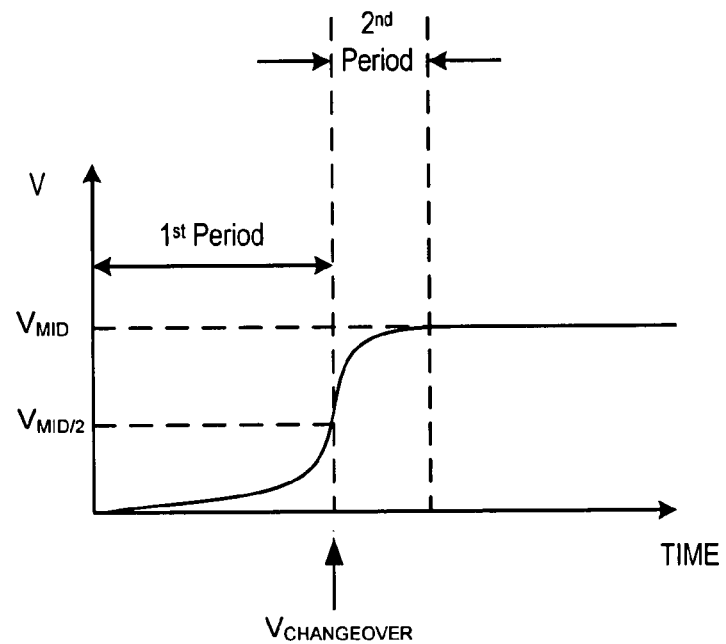
FIG. 8 shows the switching from a first mode of operation to a second mode of operation of the apparatus of FIG. 7.

Referring to FIG. 8, the comparator 171 of FIG. 7 is arranged such that it causes a switchover at point $V_{CHANGEOVER}$, $V_{CHANGEOVER}$ being a voltage level that is arranged along the rising slope of the reference voltage $V_{MID}$, and preferably around a mid-voltage point (VDD/4). In this way, any transient signals caused by the switchover from using the charging control circuit 150 to using the switch 131 will occur when the reference voltage $V_{MID}$ is actually rising. As a result, any unwanted transitions may be effectively masked at this point. In contrast, if the switchover was performed after fully charging the capacitor 135, i.e. at a point when $V_{MID}$ has settled, a new "pop" could occur during such a switchover. In other words, the charging control circuit used for preventing one "pop" could result in another "pop" being created at a different point in time. This embodiment minimises or prevents such a disadvantageous occurrence.

It will be appreciated that the comparator 171 of FIG. 7 could be replaced by other suitable circuit components, such as MOS transistors for performing the same function.

Figure 9:
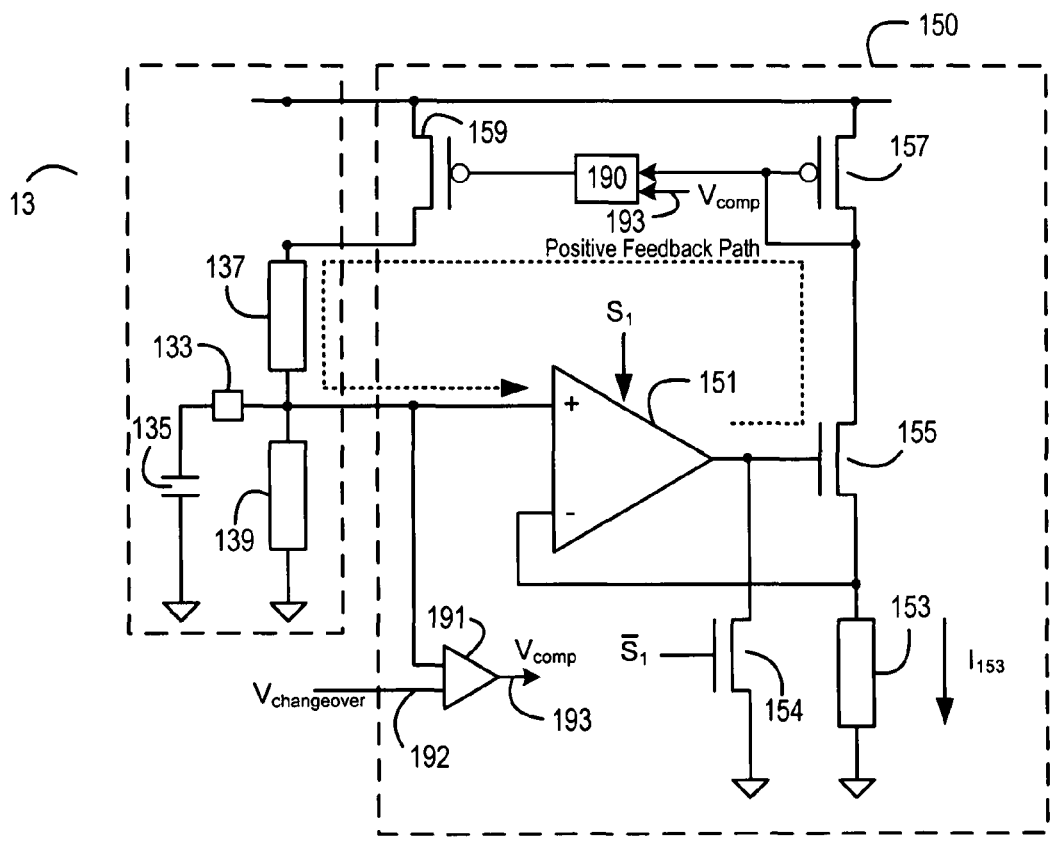
FIG. 9 shows an apparatus according to a third embodiment of the present invention.

According to an alternative embodiment, as shown in FIG. 9, the transistor 131 of the reference voltage generator circuit 13 can be disposed of, and additional circuitry provided to control transistor 159 during the second period of operation. In particular, the PMOS transistor 159 can be controlled using bypass logic 190, which is controlled by either the normal output from PMOS transistor 157, or by the output signal $V_{COMP}$ of a comparator 191. As with FIG. 7, the comparator 191 receives the reference voltage $V_{MID}$ on a first input and a threshold voltage 192 ($V_{CHANGEOVER}$) on a second input. The comparator is therefore configured to provide an output signal $V_{COMP}$ when the reference voltage $V_{MID}$ reaches a predetermined threshold, such as VDD/4. In this way, the differential amplifier 151 and feedback loop via transistors 155 and 157 are used to control the transistor 159 during a first period of the power-up operation, with the comparator 191 being used to control transistor 159 during a second period of operation. In this manner, the amplifier 151 and associated circuitry can be disabled during the second period of operation, such that only the comparator 191 and the bypass logic 190 consume power, rather than the entire components within the charging control circuit 150.

Figure 10:
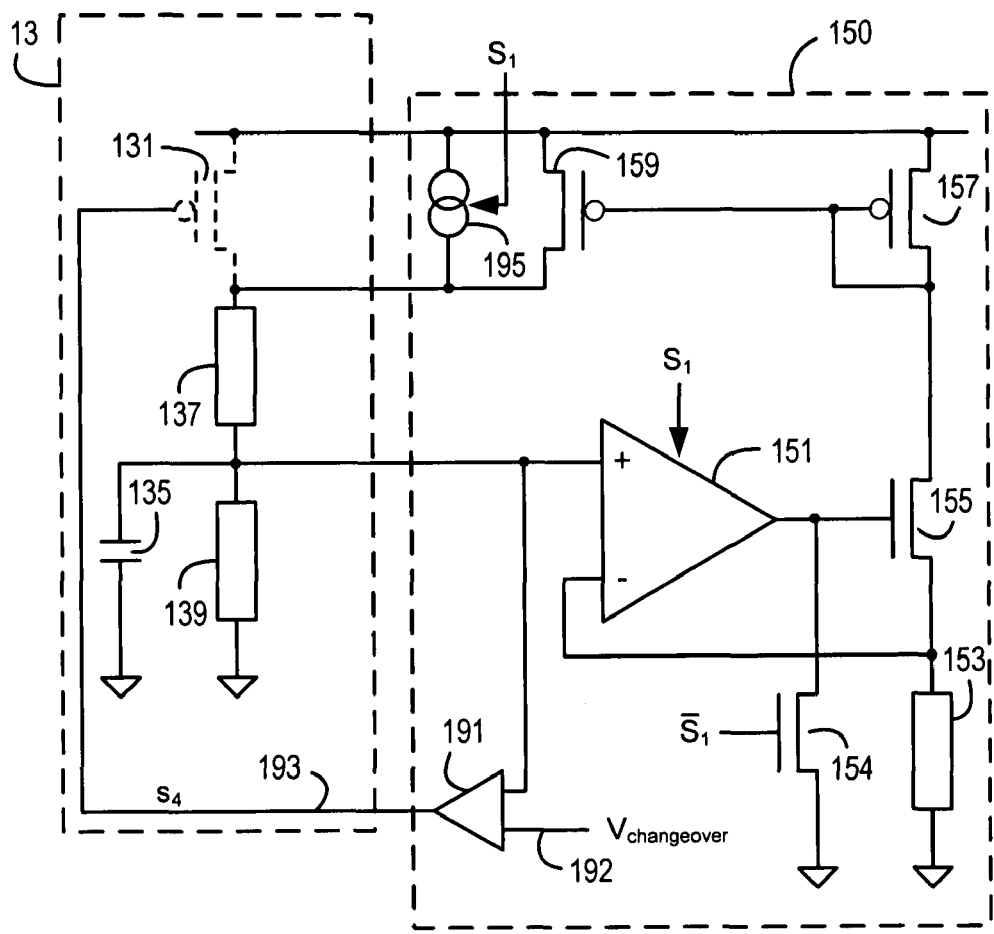
FIG. 10 shows an apparatus according to a fourth embodiment of the present invention.

FIG. 10 shows a further embodiment of the present invention that is aimed at assisting start-up of the charging control circuit 150. In a similar manner to FIGS. 5 and 7, the reference voltage generator circuit comprises a potential divider circuit comprising resistive elements 137 and 139. A decoupling capacitor 135 is connected across resistive element 139. The charging control circuit 150 comprises a differential amplifier 151 arranged in a positive feedback arrangement for limiting the current drawn through capacitor 135 during initial power-up.

As before, the output of differential amplifier 151 drives a first NMOS transistor 155, the source voltage of the NMOS transistor 155 being fed back as an input to the amplifier 151. The source is also connected to ground via resistor 153. The voltage across resistor 153 mirrors the voltage at node 133, i.e. $V_{MID}$, and as a result the current $I_{153}$ through resistor 153 is $V_{MID}/R_{153}$. This current is mirrored through PMOS transistors 157 and 159, which in turn charges capacitor 135, thereby causing voltage $V_{MID}$ to rise faster. As voltage $V_{MID}$ rises the additional current from PMOS transistor 159 also rises.

According to this embodiment of the invention, an additional current source 195 is provided for supplying a small trickle charge to the capacitor 135 during initial power-up, thereby ensuring that the differential amplifier 151 begins to operate correctly.

It will be appreciated that the features shown in the various embodiments can be combined in a variety of ways. For example, the switchover circuit 191 shown in FIG. 10 could be omitted (as shown in the embodiment of FIG. 5), or the transistor 131 of FIG. 10 omitted (as shown in FIG. 9). Other combinations of the features shown in FIGS. 5, 7, 9 and 10 are also possible, as will be appreciated by a person skilled in the art.

Figure 11:
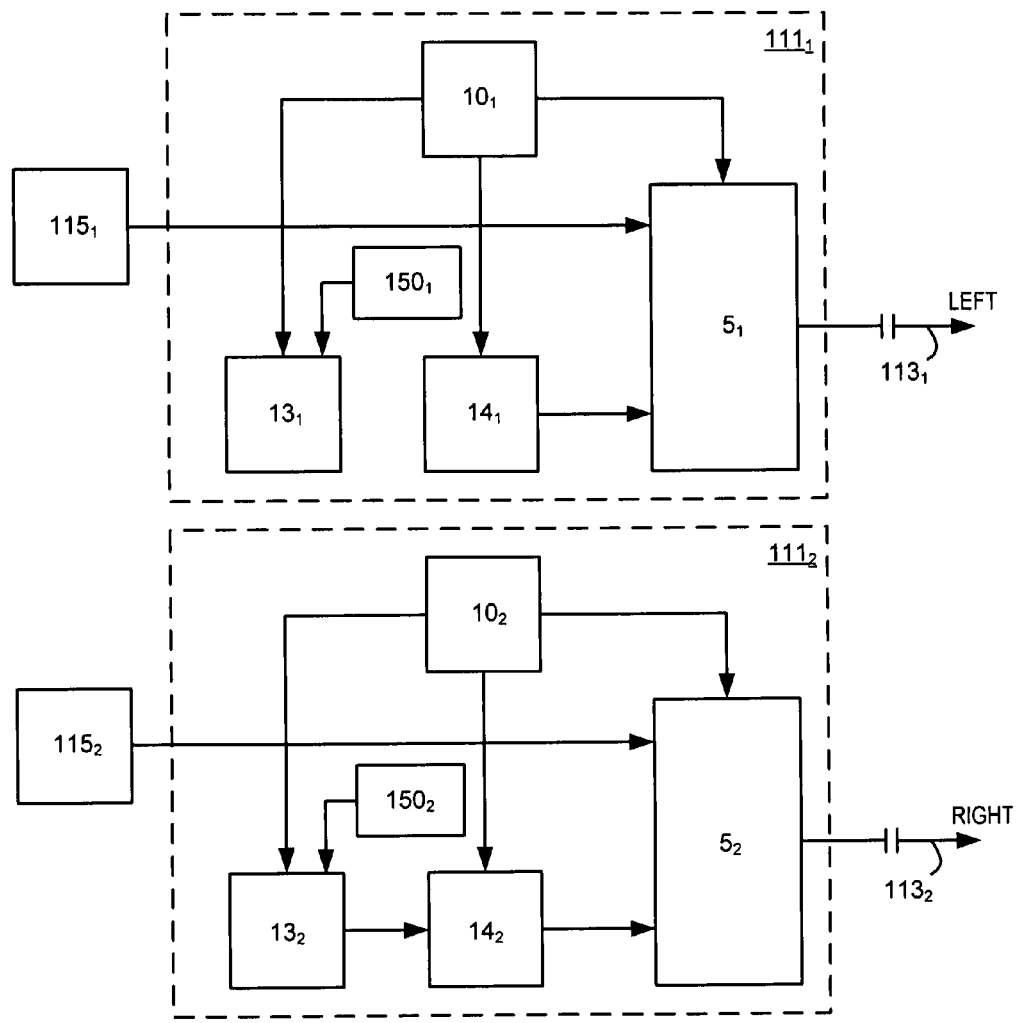
FIG. 11 shows an example of a typical application of the present invention.

While the preferred embodiments have been described in relation to an amplifier circuit that produces one audio output signal, the invention is equally applicable with audio circuits that produce multiple audio output signals, for example a stereo system as shown in FIG. 11. In FIG. 11 the audio system comprises a first audio amplifier circuit $111_1$ for producing a first audio output signal $113_1$ (e.g. left output) from a first source $115_1$, and a second audio amplifier circuit $111_2$ for producing a second audio output signal $113_2$ (e.g. right output) from a second source $115_2$. FIG. 11 is shown as having separate controls $10_1$ and $10_2$ for audio amplifiers $5_1$ and $5_2$. However, it is noted that audio amplifiers $5_1$ and $5_2$ could operate from a single common control 10. Also, while FIG. 11 shows separate $V_{MID}$ reference voltage generators $13_1$ and $13_2$, audio amplifiers $5_1$ and $5_2$ could operate from a single common reference voltage generator 13. It will be appreciated that a single or two amplifier start-up circuits according to the present invention will be employed depending upon whether the system of FIG. 11 comprises one or two $V_{MID}$ reference voltage generators $13_1$ and $13_2$.

Figure 12:
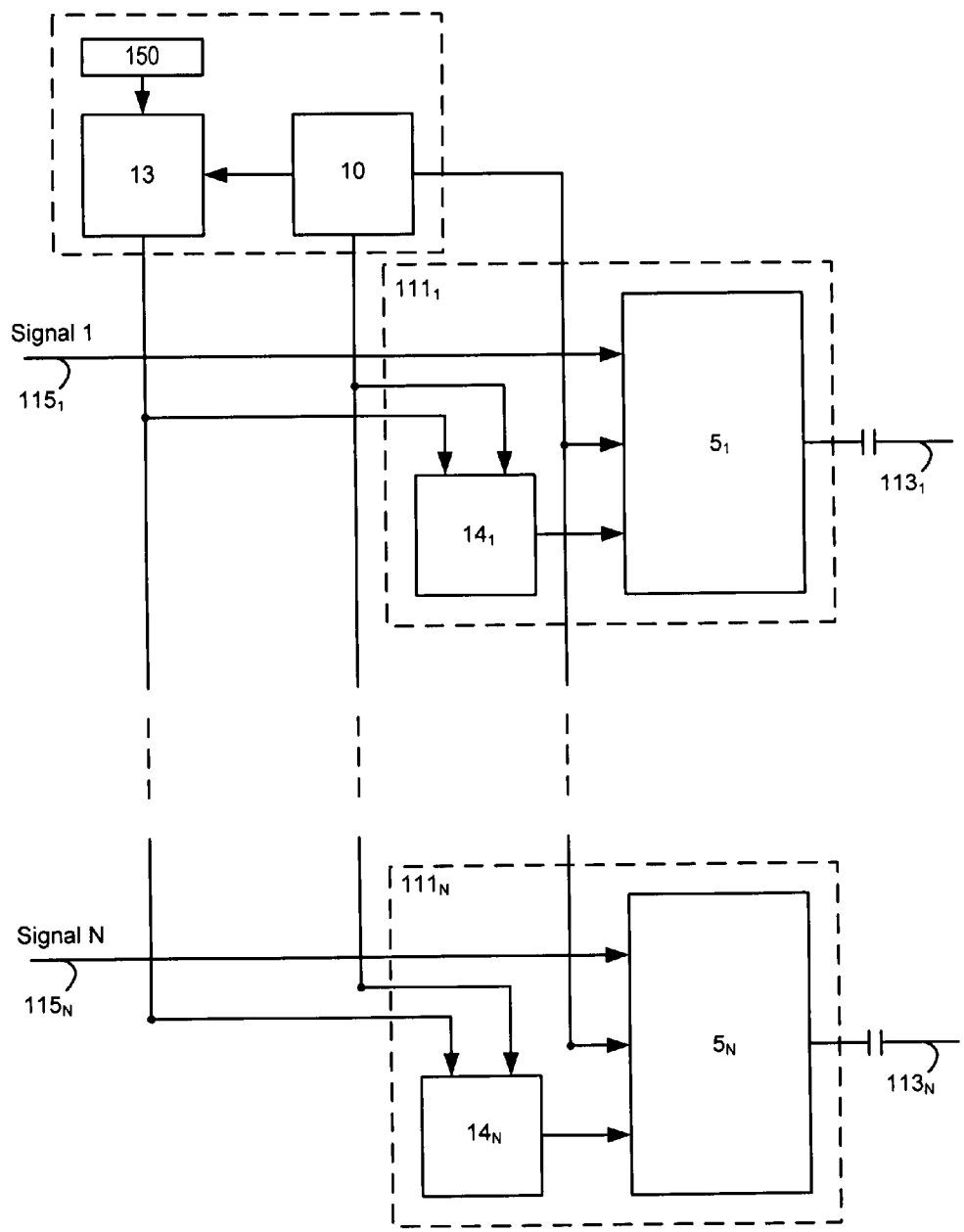
FIG. 12 shows a further example of a typical application of the present invention.

In addition, the invention can be used with an audio system as shown in FIG. 12, relating to a system having a plurality of outputs as used in home cinema applications (for example Dolby™ pro logic 5.1). A single $V_{MID}$ reference voltage generator 13 and control circuit 10 have been shown as controlling multiple audio amplifiers $5_1$ to $5_N$, each providing a separate output signal $113_1$ to $113_N$ based on input signals $115_1$ to $115_N$.

Figure 13:
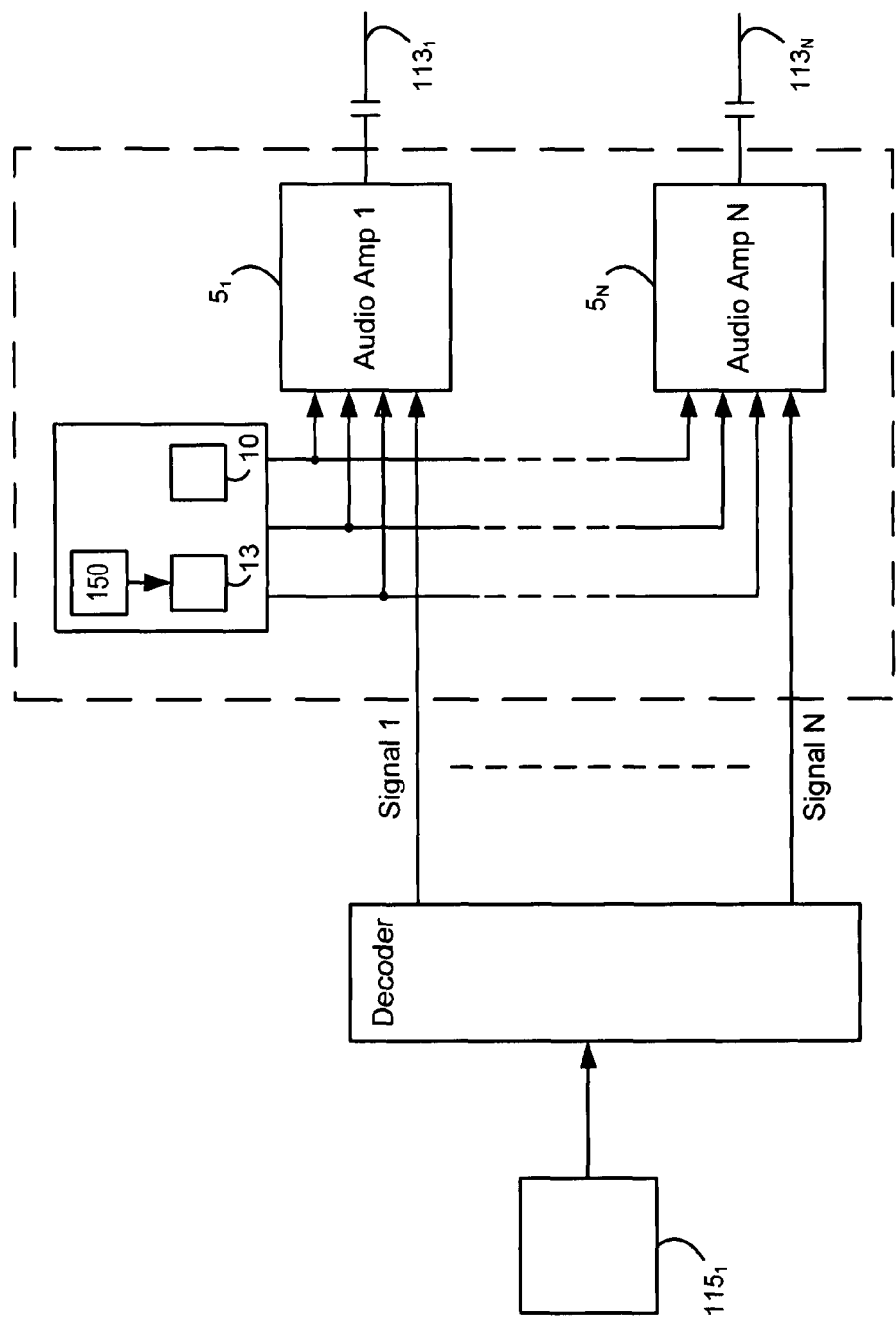
FIG. 13 shows a further example of a typical application of the present invention.
Figure 14:
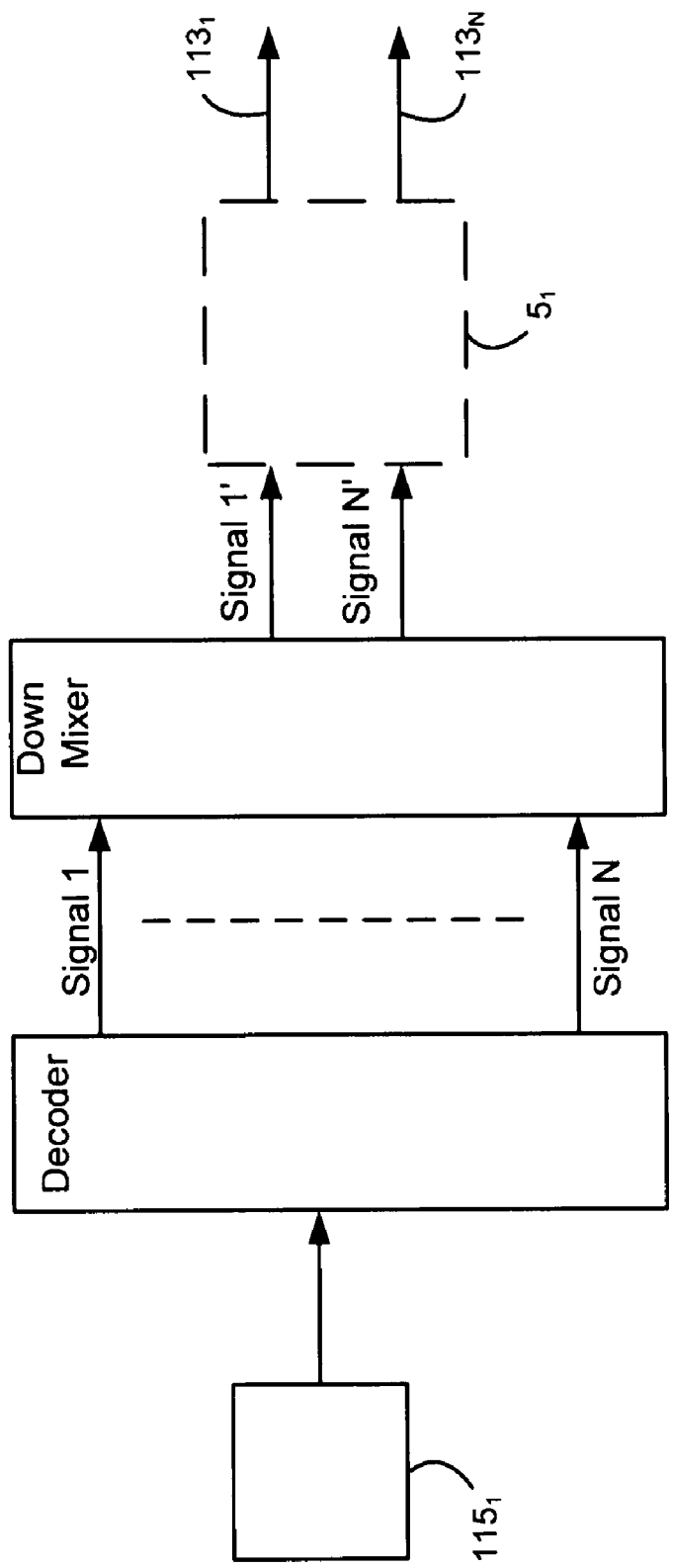
FIG. 14 shows a further example of a typical application of the present invention.

FIGS. 13 and 14 show further typical applications in which the invention can be used. FIG. 13 shows a system in which N input signals are shown as being derived from a Decoder, such as a Dolby™ Decoder, that is used to decode time multiplexed audio signals from a DVD, for example. FIG. 14 shows a system in which N signals from a decoder are fed into a Down Mixer such that signals 1 to N are mixed to form signals 1' to N' (where N'<N). For example, signals 1 to N may be the six signals associated with a home cinema system and signals 1' to N' may be left and right stereo signals which are used to produce stereo output signals 1' and N'.

The embodiments described above provide an amplifier start-up apparatus that reduces unwanted transient signals from being generated due to power-up of a reference voltage generator circuit.

It will be appreciated by a person skilled in the art that references to PMOS and NMOS transistors in the description of the preferred embodiments could be implemented by other switching devices, and in other configurations providing the same end result.

The amplifier start-up apparatus according to the invention can be used in audio apparatus including, for example, portable audio apparatus, headphone amplifiers, headphones, communications apparatus (e.g. mobile phones), in-car audio apparatus, and numerous other applications.

It should be noted that the above-mentioned embodiments illustrate rather than limit the invention, and that those skilled in the art will be able to design many alternative embodiments without departing from the scope of the appended claims or drawings. The word "comprising" does not exclude the presence of elements or steps other than those listed in a claim, "a" or "an" does not exclude a plurality, and a single element or other unit may fulfil the functions of several units recited in the claims. Any reference signs in the claims shall not be construed so as to limit their scope.

What is claimed is:

1. An amplifier start-up apparatus for reducing transient signals in an audio circuit comprising a reference voltage generator circuit for generating a reference voltage, the reference voltage generator circuit comprising a capacitor for maintaining the reference voltage at a desired level, the apparatus comprising:
    a charging control circuit for controlling the operation of the reference voltage generator circuit during power-up;
    the charging control circuit comprising an amplifier with a positive feedback path for controlling a current flow to the capacitor;
    wherein the charging control circuit is configured and controlled to operate in a first mode of operation during a first period, and a second mode of operation during a second period, and wherein the charging control circuit comprises switching means for switching from the first mode of operation to the second mode of operation after charging for a period of time.

2. An apparatus as claimed in claim 1, wherein the charging control circuit comprises a first transistor device connected between the capacitor and a supply voltage, and wherein the amplifier with the positive feedback path is configured to control the rate of flow of current through the first transistor device.

3. An apparatus as claimed in claim 2, wherein the rate of flow of current through the first transistor device is controlled based on the voltage level of the reference voltage being generated.

4. An apparatus as claimed in claim 1, wherein the charging control circuit is configured to disable the amplifier with the positive feedback path when operating in the second mode of operation during the second period.

5. An apparatus as claimed in claim 4, wherein the charging control circuit comprises bypass logic for controlling the first transistor device when the amplifier with the positive feedback path is disabled during the second period.

6. An apparatus as claimed in claim 4, wherein the charging control circuit comprises a second transistor device for maintaining a charge on the capacitor when the amplifier with the positive feedback path is disabled during the second period.

7. An apparatus as claimed in claim 1, wherein the switching means is adapted to switch from the first mode of operation to the second mode of operation when the reference voltage has reached a predetermined threshold voltage.

8. An apparatus as claimed in claim 1, wherein the switching means comprises a comparator device, the comparator device connected to receive the reference voltage being generated on a first input and the threshold voltage on a second input.

9. An apparatus as claimed in claim 1, further comprising a start-up circuit for assisting the activation of the charging control circuit.

10. An apparatus as claimed in claim 9, wherein the start-up circuit comprises a current source for providing an initial trickle charge to the charging control circuit.

11. An apparatus as claimed in claim 1, wherein the reference voltage generator circuit comprises a potential divider circuit for producing the reference voltage, the potential divider circuit comprising first and second resistor devices connected in series between a power supply and ground connection.

12. An apparatus as claimed in claim 11, wherein the capacitor device is connected between ground and a common node connecting the first and second resistors.

13. A method for reducing transient signals in an audio circuit comprising a reference voltage generator circuit for generating a reference voltage, the reference voltage generator circuit comprising a capacitor for maintaining the reference voltage at a desired level, the method comprising the steps of:

providing a charging control circuit for controlling the operation of the reference voltage generator circuit during power-up;

controlling a current flow to the capacitor of the reference voltage generator circuit using an amplifier with a positive feedback path;

configuring the charging control circuit to operate in a first mode of operation during a first period, and a second mode of operation during a second period; and providing switching means for switching from the first mode of operation to the second mode of operation after charging for a period of time.

14. A method as claimed in claim 13, further comprising the step of providing a first transistor device between the capacitor and a supply voltage, and configuring the amplifier with the positive feedback path to control the rate of flow of current through the first transistor device.

15. A method as claimed in claim 14, wherein the step of controlling the rate of flow of current through the first transistor device comprises controlling the current flow based on the voltage level of the reference voltage being generated.

16. A method as claimed in claim 13, further comprising the step of disabling the amplifier with the positive feedback path when operating in the second mode of operation during the second period.

17. A method as claimed in claim 16, further comprising the step of providing bypass logic for controlling the first transistor device when the amplifier with the positive feedback path is disabled during the second period.

18. A method as claimed in claim 16, further comprising the step of providing a second transistor device for maintaining a charge on the capacitor device when the amplifier with the positive feedback path is disabled during the second period.

19. A method as claimed in claim 13, wherein the switching step comprises switching from the first mode of operation to the second mode of operation when the reference voltage has reached a predetermined threshold voltage.

20. A method as claimed in claim 13, wherein the switching means comprises a comparator device, the comparator device connected to receive the reference voltage being generated on a first input and the threshold voltage on a second input.

21. A method as claimed in claim 13, wherein the threshold voltage is set such that it corresponds to a voltage level where the reference voltage is rising.

22. A method as claimed in claim 13, further comprising the step of providing an initial trickle charge to the charging control circuit.

23. An audio apparatus incorporating an amplifier start-up apparatus according to claim 1.

24. A portable audio apparatus incorporating an amplifier start-up apparatus according to claim 1.

25. A headphone amplifier incorporating an amplifier start-up apparatus or part thereof according to claim 1.

26. A headphone incorporating an amplifier start-up apparatus according to claim 1.

27. A communications apparatus incorporating an amplifier start-up apparatus according to claim 1.

28. An in-car audio apparatus incorporating an amplifier start-up apparatus according to claim 1.

29. A reference voltage signal for use in an audio circuit, the reference voltage signal configured to have an "S" type shape using the amplifier start-up apparatus according to claim 1.

* * * * *